United States Patent [19]
Tanaka

[11] Patent Number: 6,116,493
[45] Date of Patent: Sep. 12, 2000

[54] FLIP-CHIP BONDING PARTS, FLIP-CHIP BONDING CONFIRMATION PARTS AND A FLIP-CHIP BONDING METHOD

[75] Inventor: Yuji Tanaka, Kokubunji, Japan

[73] Assignee: Kabushiki Kaisha Shinkawa, Tokyo, Japan

[21] Appl. No.: 09/221,062

[22] Filed: Dec. 28, 1998

[30] Foreign Application Priority Data

Dec. 25, 1997 [JP] Japan ................................. 9-367439

[51] Int. Cl.[7] ............................................. B23K 37/00
[52] U.S. Cl. ........................ 228/105; 228/103; 228/203; 29/729
[58] Field of Search .................................. 228/105, 103, 228/203, 8, 9, 10, 12; 29/729, 739, 740

[56] References Cited

U.S. PATENT DOCUMENTS

| | | | |
|---|---|---|---|
| 3,696,229 | 10/1972 | Angelucci et al. | 219/85 |
| 4,369,458 | 1/1983 | Thomas et al. | 357/30 |
| 5,212,880 | 5/1993 | Nishiguchi et al. | 29/739 |
| 5,356,947 | 10/1994 | Ali et al. | 522/57 |
| 5,790,728 | 8/1998 | Wentworth | 385/39 |
| 5,851,894 | 12/1998 | Ramm | 438/311 |
| 5,949,655 | 9/1999 | Glenn | 361/783 |

FOREIGN PATENT DOCUMENTS

| | | |
|---|---|---|
| 5-29546 | 2/1993 | Japan . |
| 6-28272 | 4/1994 | Japan . |

*Primary Examiner*—Patrick Ryan
*Assistant Examiner*—M. Alexandra Elve
*Attorney, Agent, or Firm*—Koda & Androlia

[57] ABSTRACT

So as to allow bonding precision to be confirmed on a bonding apparatus, both a confirmation substrate part and a confirmation chip part, which are flip-chip bonding confirmation parts used in the bonding of semiconductor devices that have daisy-chain type patterns, are formed as transparent plate-form members and daisy-chain type patterns are provided thereon.

8 Claims, 5 Drawing Sheets

FLIP-CHIP BONDING PARTS, FLIP-CHIP BONDING CONFIRMATION PARTS AND A FLIP-CHIP BONDING METHOD

BACKGROUND OF THE INVENTION

1. Field of the Invention

The present invention relates to flip-chip bonding parts used in the bonding of a semiconductor device, flip-chip bonding confirmation parts used in a semiconductor device with a daisy-chain type pattern, and a flip-chip bonding method.

2. Prior Art

For example, semiconductor devices with daisy-chain type patterns are manufactured by bonding a chip directly to a substrate, and then injecting an underfilling between the two. On the substrate side, patterns and pads are formed on a printed substrate or a ceramic substrate; and on the chip side, pads are formed on a silicon chip. Since the substrate and chip are opaque, the patterns and pads on the substrate and chip cannot be observed by transmitted light.

The above-described semiconductor devices having daisy-chain type patterns are universally known as disclosed in, for example, Japanese Patent Application Laid-Open (Kokai) No. H5-29546, and nave a pattern system in which the respective pads on the substrate and the respective pads on the chip are connected between two terminals used for confirmation of electrical continuity (formed on the substrate) so that a chain is formed when the substrate and chip are bonded with the pad pattern formed on the substrate and the pad pattern formed on the chip superimposed.

Bonding of a semiconductor device provided with a daisy-chain type pattern is accomplished by the process shown in FIG. 5.

As seen from FIG. 5(a), a substrate 1 is held by a substrate chuck 2 with the pattern and pad surfaces of the substrate 1 facing upward, and a chip 3 is held by a chip chuck 4 with the pattern and pad surfaces of the chip 3 facing downward; and the chip 3 is positioned above the substrate 1. Next, as shown in FIG. 5(b), an optical probe 5 which has detection parts on its upper and lower surfaces is moved into the space between the substrate 1 and chip 3 in the direction indicated by arrow A, and the respective patterns and pads of the substrate 1 and chip 3 are detected by the optical probe 5. Then, the substrate chuck 2 and chip chuck 4 are moved relative to each other so that the substrate 1 and chip 3 are leveled and aligned.

Afterward, as shown in FIG. 5(c), the optical probe 5 is moved away from the space between the substrate 1 and chip 3 in the direction indicated by arrow B. Then, as shown in FIG. 5(d), the substrate chuck 2 is raised, so that the substrate 1 and chip 3 are bonded. Thereafter, as shown in FIG. 5(e), the substrate chuck 2 is lowered, thus finishing the bonding of the substrate 1 and chip 3.

The probe described in Japanese Patent Application Publication (Kokoku) No. H6-28272 may be cited as an example of the optical probe 5.

The confirmation of bonding precision in the above semiconductor device is accomplished in the following manner: a confirmation element which is either the substrate or chip and consists of a transparent glass is bonded, this bonded sample is removed from the bonding apparatus, and then positional deviations of the patterns and pads on the substrate and chip are measured by a length-measuring device from the glass side. Thus, since it is necessary to remove the bonded confirmation element from the bonding apparatus in order to perform measurements, rapid confirmation of the bonding precision is impossible.

Furthermore, in conventional confirmation elements which are transparent only on one side, no daisy-chain type pattern is provided, and the bonded semiconductor device used for confirmation is opaque, thus rendering it impossible to confirm an electrical continuity. As a result, confirmation of electrical continuity requires the inspection of an actual opaque semiconductor device, and the confirmation of bonding precision and confirmation of electrical continuity must be performed separately. Furthermore, since the device is opaque, the internal portions of the bonded parts cannot be checked; and the underfilling injection conditions when a sealing material is injected between the substrate and chip in a subsequent process cannot be observed.

SUMMARY OF THE INVENTION

Accordingly, the first object of the present invention is to provide a flip-chip bonding part used in bonding of a semiconductor device, a flip-chip bonding confirmation part and a flip-chip bonding method which allow the bonding precision to be confirmed in the bonding apparatus.

The second object of the present invention is to provide a flip-chip bonding part used in bonding of a semiconductor device, a flip-chip bonding confirmation part and a flip-chip bonding method which allow both the bonding precision and the electrical continuity to be confirmed.

The first means of the flip-chip bonding part of the present invention for accomplishing the objects is characterized in that both the substrate part and the chip part, both making the flip-chip bonding part, are formed as transparent plate-form members.

The second means of the present invention for accomplishing the objects is characterized in that in the above-described first means, respective measurement scales used for confirmation of bond alignment precision are formed in corresponding locations on the substrate part and chip part.

The third means of the present invention for accomplishing the objects is characterized in that in the above-described second means, the measurement scales used for bond alignment precision is comprised of two perpendicular axes consisting of an X-axis measurement scale and a Y-axis measurement scale.

The fourth means of the present invention for accomplishing the objects is characterized in that in the above-described third means, the spacing of the X-axis measurement scale and Y-axis measurement scale of the chip part is set so as not to be equal to (that is, larger or smaller than) the spacing of the X-axis measurement scale and Y-axis measurement scale of the substrate part; and in addition, the chip part is provided with an X-axis scale reference line and Y-axis scale reference line which coincide with an X-axis scale reference line and Y-axis scale reference line provided on the substrate part.

Furthermore, the flip-chip bonding confirmation part of the present invention for accomplishing the objects is characterized in that the flip-chip bonding part of the above-described first, second, third or fourth means is used as a flip-chip bonding confirmation part used in the bonding of semiconductor devices having daisy-chain type patterns, and the substrate part and chip part are respectively a confirmation substrate part and confirmation chip part, and daisy-chain type patterns are formed thereon.

In addition, the flip-chip bonding method of the present invention for accomplishing the object is characterized in that flip-chip bonding is performed using the flip-chip bonding part or the flip-chip bonding confirmation part of the above-described first, second, third, fourth or fifth means; and the bonding precision and bonding as well as the electrical continuity conditions are confirmed.

DETAILED DESCRIPTION OF THE PREFERRED EMBODIMENTS

Embodiments of the present invention will be described with reference to FIGS. 1 through 4 in which a confirmation substrate part 10, the chip bonding area on this confirmation substrate part 10 and confirmation chip part 30 are disclosed.

Figure 2:
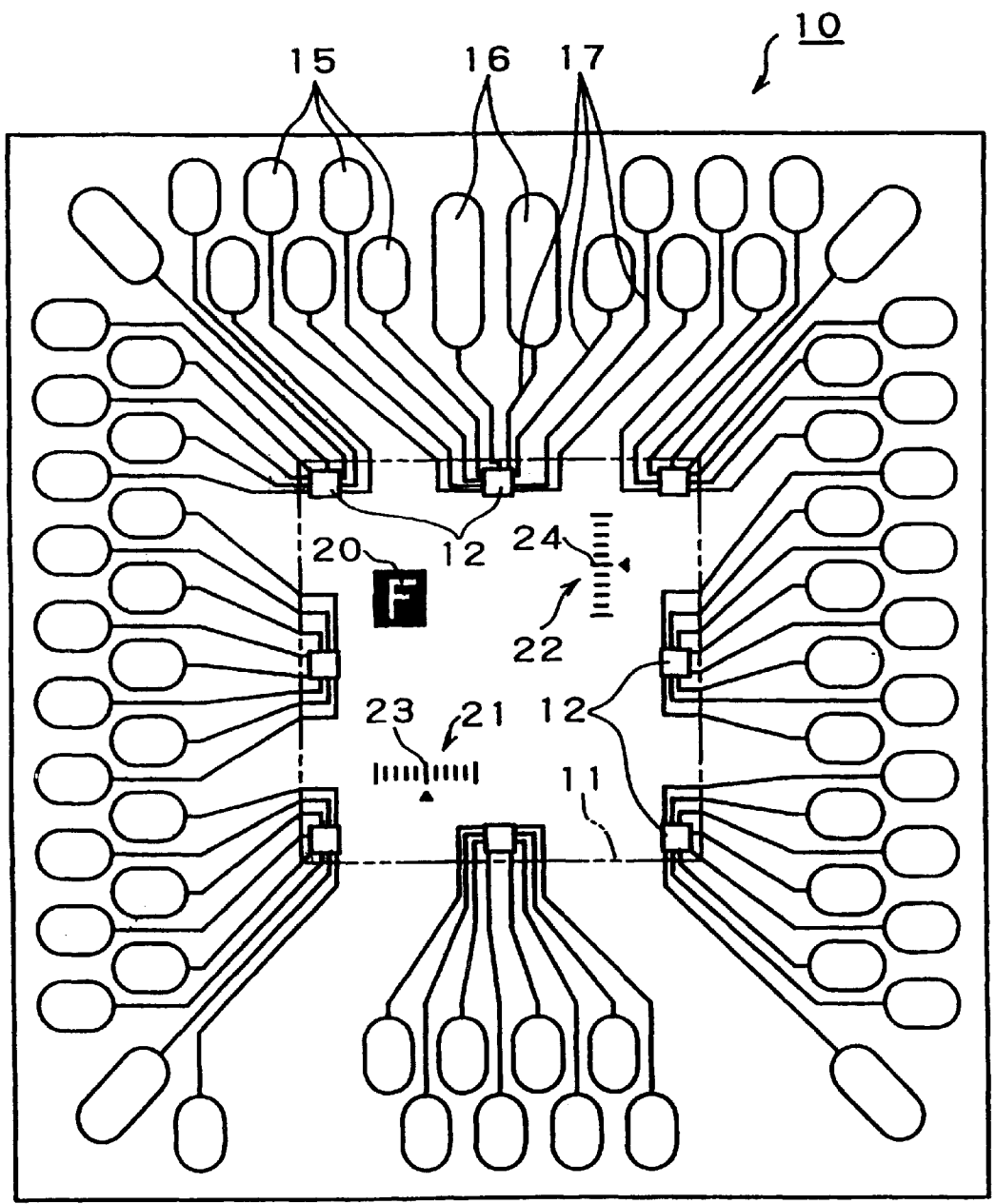
FIG. 2 is a plan view of the overall confirmation substrate part.
Figure 3:
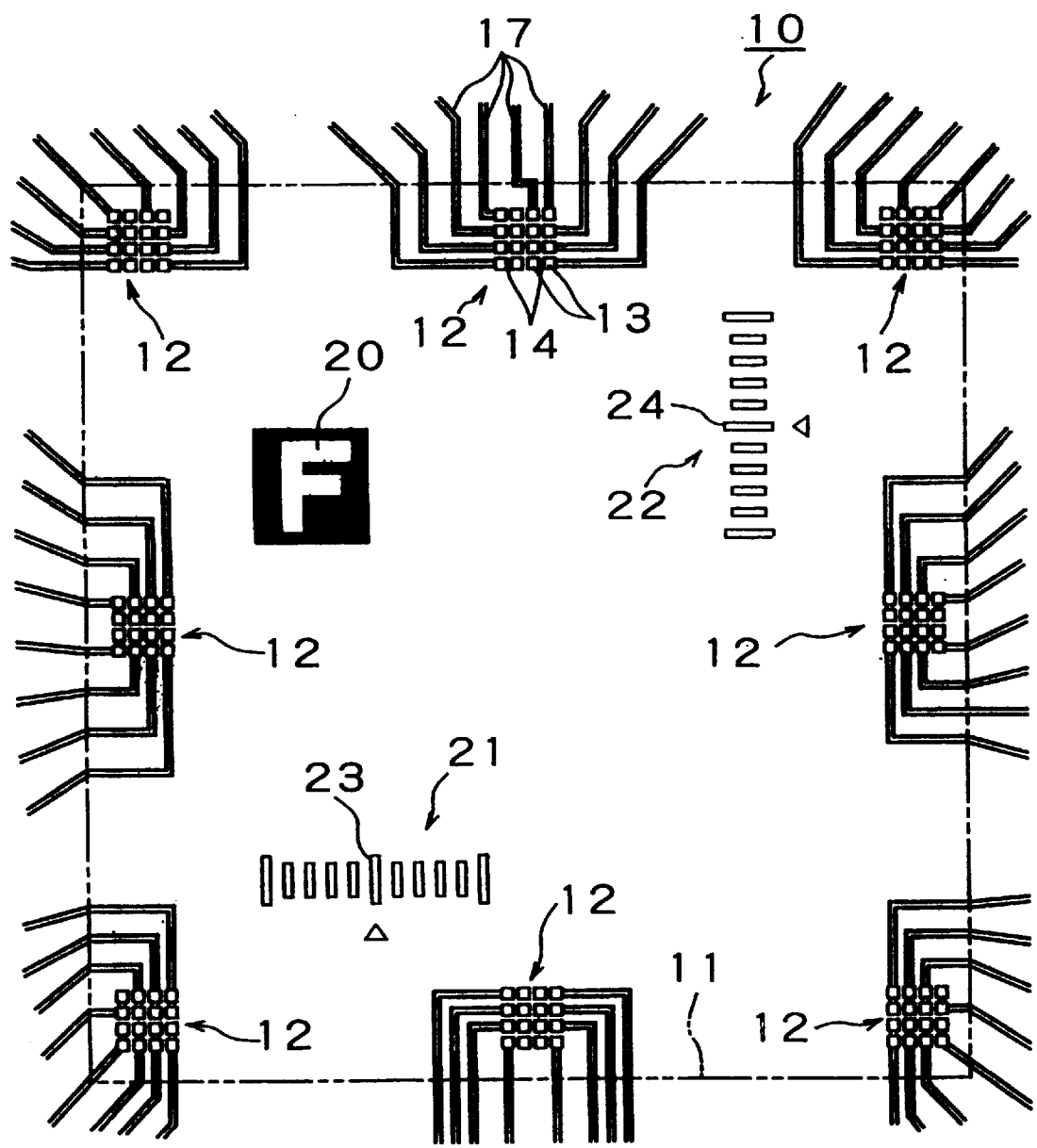
FIG. 3 is an enlarged illustration of the essential parts in FIG. 2.

The first characteristic feature of the present invention is that the confirmation substrate part 10 and confirmation chip part 30 respectively consist of transparent glass (or glass plate). In FIGS. 2 and 3, the surface on which pad patterns and lead patterns are formed by a universally known daisy-chain system is shown as the upper surface; and in FIG. 4 the surface on which pad patterns are formed by a universally known daisy-chain system is shown as the undersurface, and in FIG. 4 the pad patterns are seen from the upper surface (or from above) through the confirmation chip part 30.

Figure 4:
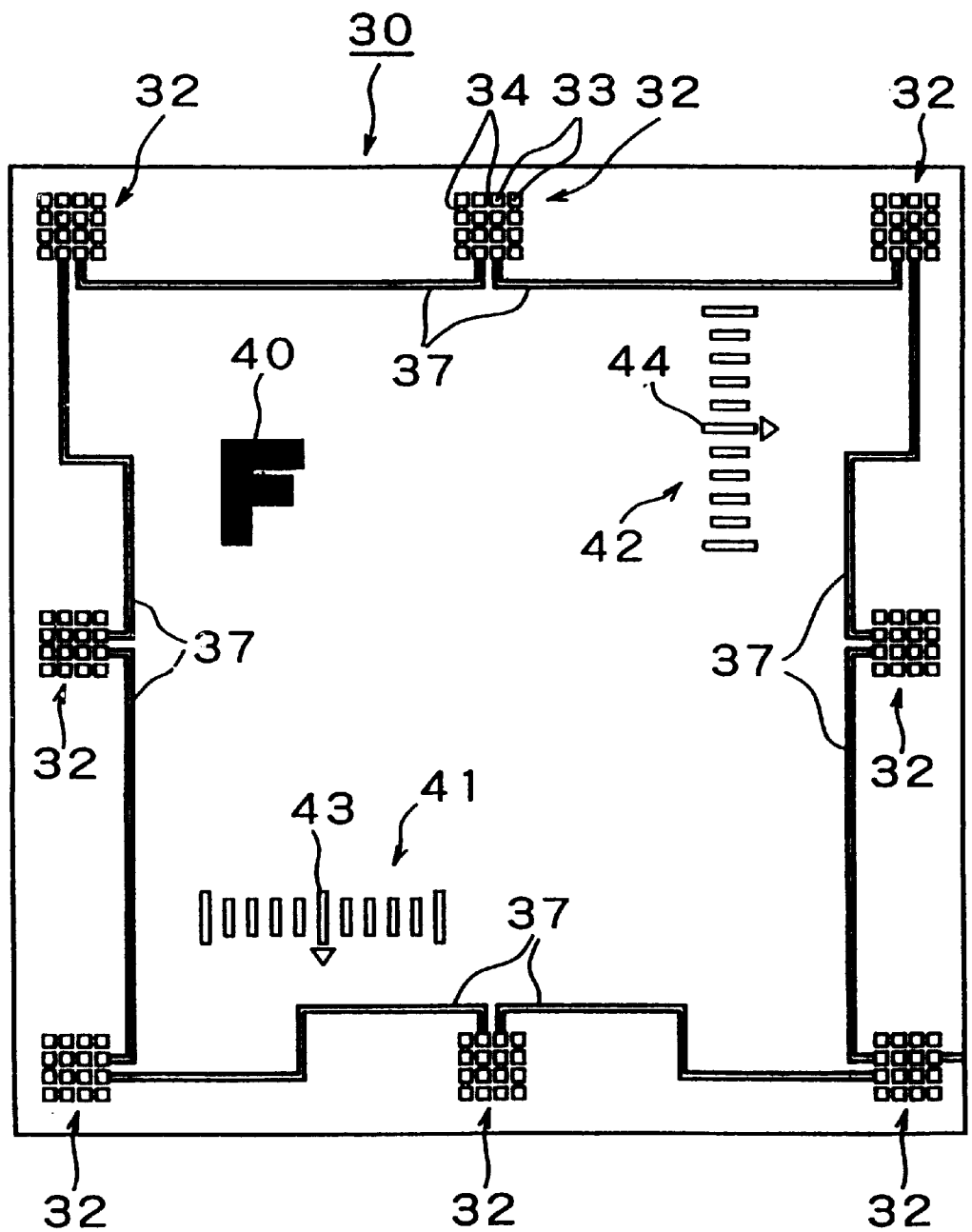
FIG. 4 shows a confirmation chip part and is a plan view of the pattern formed on the undersurface as seen through the part from the upper surface.

The pad patterns, lead patterns and associated wiring shown in FIGS. 2 and 3, and the pad patterns and associated wiring shown in FIG. 4, are determined by the type of semiconductor device, and they have no relation to the gist of the present invention; accordingly, these will be described only briefly below.

First, the pad patterns, lead patterns and associated wiring on the confirmation substrate part 10 will be described with reference to FIGS. 2 and 3.

The reference numeral 11 indicates a chip bonding area to which the confirmation chip part 30 is bonded. Eight pad groups 12 are formed within the chip bonding area 11. Each pad group 12 consists of 16 pads 13. Furthermore, some of the adjacent pads 13 are connected to each other by connecting parts 14. A plurality of lead terminals 15 and two electrical continuity confirmation terminals 16 are formed on the peripheral portions of the confirmation substrate part 10. These lead terminals 15 and electrical continuity confirmation terminals 16 are connected to the pads 13 of the corresponding pad groups 12 by wiring 17.

The pad patterns and associated wiring of the confirmation chip part 30 will be described with reference to FIG. 4.

Eight pad groups 32 are formed in positions corresponding to the pad groups 12 of the confirmation substrate part 10; and in each of these pad groups 32, 16 (sixteen) pads 33 are formed in the same pattern as the pads 13 of the confirmation substrate part 10. Furthermore, some of the adjacent pads 33 are connected to each other by connecting parts 34; and some of the pads 33 of the pad groups 32 are connected to the pads 33 of other pad groups 32 by wiring 37.

The connecting parts 14 of the confirmation substrate part and the connecting parts 34 and wiring 37 of the confirmation chip part 30 are formed in a daisy-chain type pattern so that in a case where the confirmation chip part 30 is bonded to the confirmation substrate part 10, electrical continuity is obtained when the continuity test terminals 16 of the confirmation substrate part 10 are caused to make contact.

Next, the constituting characteristic features of the present embodiment will be described.

A white cut-out directional alignment mark 20 is formed within the chip bonding area 11 of the confirmation substrate part 10 as shown in FIGS. 2 and 3. Furthermore, within the chip bonding area 11, an X-axis measurement scale 21 which is used to confirm the bond alignment precision is formed in the direction of the X axis (constituting one of two perpendicular axes), and a Y-axis measurement scale 22 is also formed in the direction of the Y axis (constituting the other of the two perpendicular axes). Moreover, lines indicated by a Δ symbol are the X-axis scale reference line 23 and Y-axis scale reference line 24.

A black directional mark 40 which is similar in shape but slightly thinner than the directional alignment mark 20 of the confirmation substrate part 10 is formed on the confirmation chip part 30 so as to positionally correspond to the directional alignment mark 20. Furthermore, an X-axis measurement scale 41 and Y-axis measurement scale 42 are formed in positions corresponding to the X-axis scale reference line 23 and Y-axis scale reference line 24 of the X-axis measurement scale 21 and Y-axis measurement scale 22 of the confirmation substrate part 10.

The X-axis scale reference line 43 of the X-axis measurement scale 41 is formed in a position which coincides with the X-axis scale reference line 23; and the scale spacing of the X-axis measurement scale 41 is formed so that it is, for example, 2 microns smaller than the scale spacing of the X-axis measurement scale 21. The Y-axis scale reference line 44 of the Y-axis measurement scale 42 is similarly formed in a position which coincides with the Y-axis scale reference line 24, and the scale spacing of the Y-axis measurement scale 42 is formed so that it is, for example, 2 microns smaller than the scale spacing of the Y-axis measurement scale 22.

The X-axis measurement scale 41 is slightly shifted in the direction of the Y axis so that the position of the X-axis measurement scale 41 can be read when the X-axis measurement scale 41 is superimposed on the X-axis measurement scale 21. The Y-axis measurement scale 42 is also slightly shifted in the direction of the X axis so that the Y-axis measurement scale 42 can be read when the Y-axis measurement scale 42 is superimposed on the Y-axis measurement scale 22.

Figure 5:
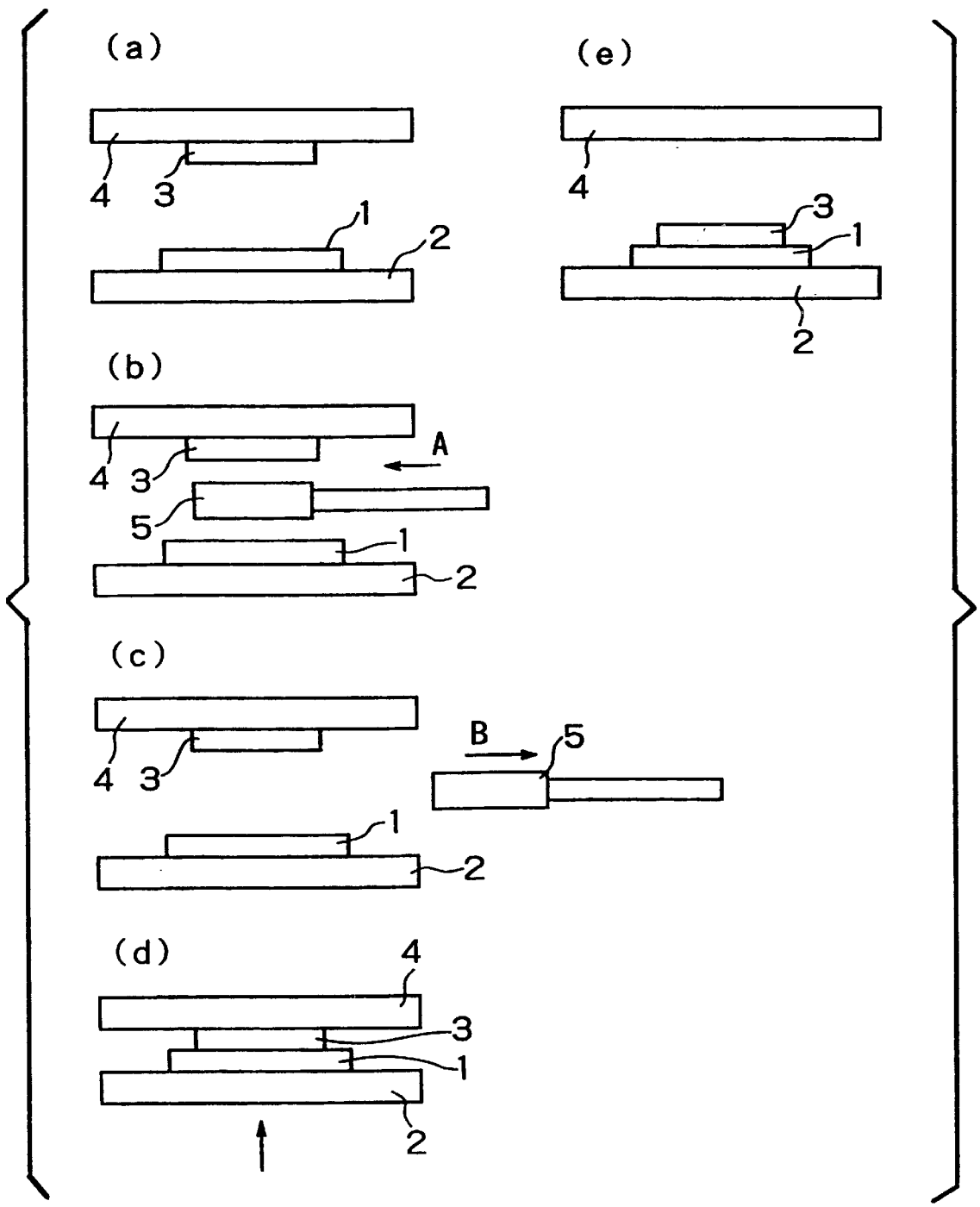
FIG. 5 is an explanatory diagram which illustrates a conventional flip-chip bonding method.

With the structure as described above, after balls (not shown) are formed on the respective pads 33 of the confirmation chip part 30, the confirmation chip part 30 is bonded to the confirmation substrate part 10 in the same manner as in the conventional bonding method shown in FIG. 5. More specific description will be made as follows with the confirmation substrate part 10 and confirmation chip part 30 substituted for the substrate 1 and substrate chuck 2 in FIG. 5:

As shown in FIG. 5(a), the confirmation substrate part 10 (which is the substrate 1 in FIG. 5) is held by the substrate chuck 2 with the surfaces of the pads 13 of the confirmation substrate part 10 (1) facing upward, and the confirmation chip part 30 (which is the chip 3 in FIG. 5) is held by the chip chuck 4 with the surfaces of the pads 33 of the confirmation chip part 30 facing downward. The confirmation chip part 30 is positioned above the confirmation substrate part 10.

Next, as shown in FIG. 5(*b*), the optical probe 5 is inserted between the confirmation substrate part 10 (1) and the confirmation chip part 30 (3), and the respective patterns and pads 13 and 33 of the confirmation substrate part 10 (1) and confirmation chip part 30 (3) are detected by the optical probe 5. Then, the substrate chuck 2 and chip chuck 4 are moved relative to each other so that the confirmation substrate part 10 (1) and confirmation chip part 30 (3) are leveled and aligned.

Afterward, as shown in FIG. 5(*c*), the optical probe 5 is withdrawn; and then as shown in FIG. 5(*d*), the substrate chuck 2 is raised so that the confirmation substrate part 10 (1) and confirmation chip part 30 (3) are bonded.

After this, as shown in FIG. 5(*e*), the substrate chuck 2 is lowered, so that the bonding process is completed.

Figure 1:
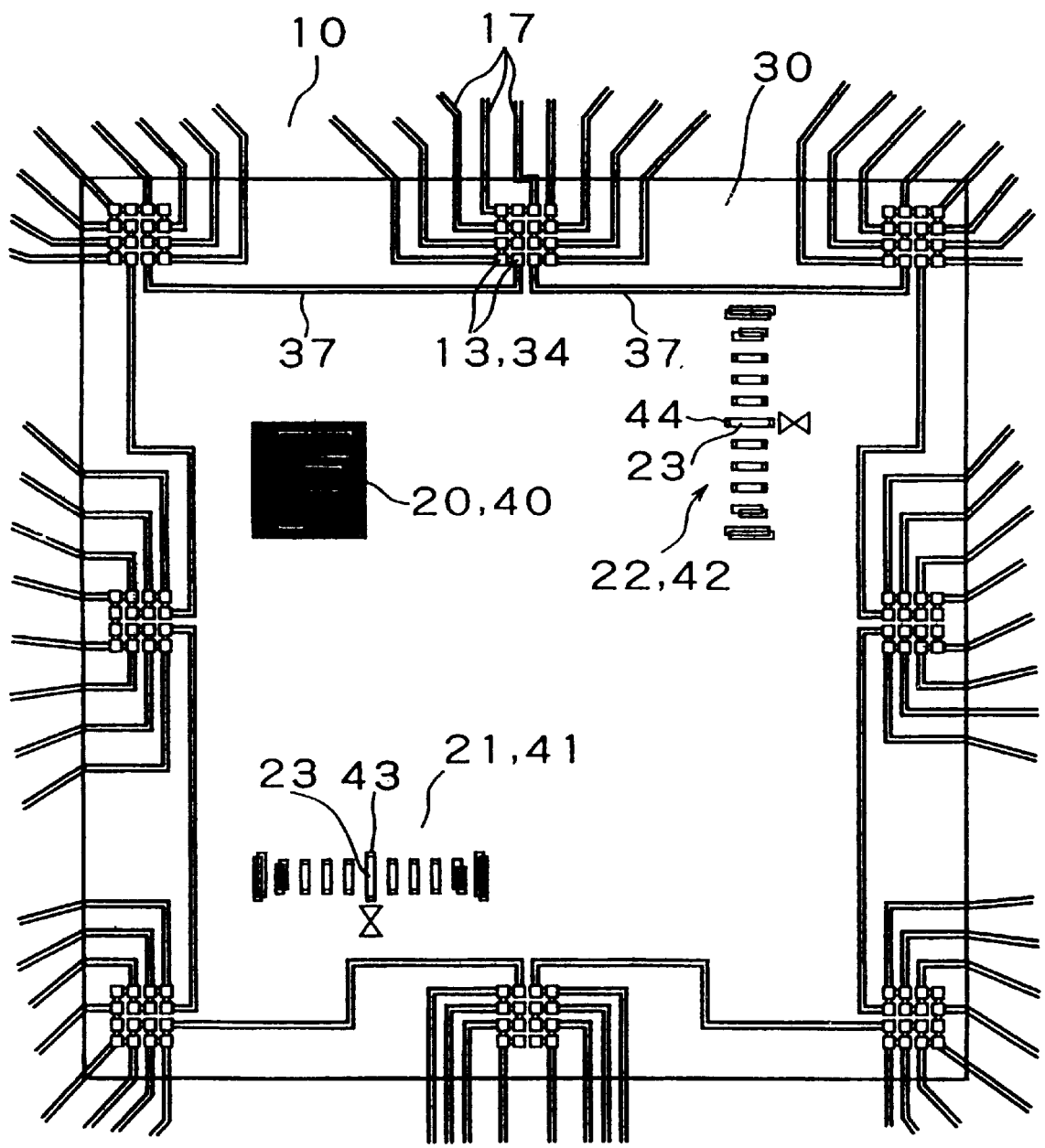
FIG. 1 is a plan view of one embodiment of the flip-chip bonding confirmation part according to the present invention.

FIG. 1 shows the parts of a semiconductor device in which bonding has been performed as described above, and the device is shown from the side of the confirmation chip part 30.

As described earlier, the confirmation substrate part 10 and confirmation chip part 30 both consist of transparent glass and are formed by daisy-chain type patterns; accordingly, it is possible to observe the bonding precision and bonding conditions after a single bonding operation; and in addition, electrical continuity can be confirmed through the terminals 16 that are used for confirming an electrical continuity. Furthermore, the injection conditions can be confirmed via the confirmation chip part 30 in an underfilling injection test performed following bonding.

Furthermore, because of the X-axis measurement scale 21 and Y-axis measurement scale 22 formed on the confirmation substrate part 10 and the X-axis measurement scale 41 and Y-axis measurement scale 42 formed on the confirmation chip part 30, the bonding precision (positional deviation) in the direction of the X axis and in the direction of the Y axis can be measured by means of the relationship between the X-axis measurement scale 21 and X-axis measurement scale 22 and the relationship between the Y-axis measurement scale 22 and Y-axis measurement scale 42. In other words, when the X-axis scale reference line 23 of the X-axis measurement scale 21 and the X-axis scale reference line 43 of the X-axis measurement scale 41 coincide, there is no positional deviation in the direction of the X axis. Likewise, when the Y-axis scale reference line 24 of the Y-axis measurement scale 22 and the Y-axis scale reference line 44 of the Y-axis measurement scale 42 coincide, there is no positional deviation in the direction of the Y axis. In this case, for example, if the scale spacing of the X-axis measurement scale 41 is set to be 2 microns smaller than the scale spacing of the X-axis measurement scale 21, then the fifth line of the X-axis measurement scale 41 from the X-axis scale reference line 43 is shifted by a scale spacing of 10 microns (=5 lines of the X-axis measurement scale 21×2 microns).

If there is a positional deviation of the substrate part 10 and chip part 30 in the direction of the X axis, the X-axis scale reference line 23 and X-axis scale reference line 43 do not coincide. Thus, by examining the scale lines where the X-axis measurement scales 21 and 41 coincide, the amount of deviation can be read. If, for instance, the third line of the X-axis measurement scale 41 coincides with the third line to the right from the X-axis scale reference line 23, then, in a case where the scale spacing of the X-axis measurement scale 41 is 2 microns smaller than the scale spacing of the X-axis measurement scale 21, it is ascertained that the confirmation chip part 30 is shifted 3×2 microns, that is, 6 microns, to the right in the direction of the X axis with respect to the confirmation substrate part 10. The same is true of positional deviations in the direction of the Y axis.

Accordingly, upon actual bonding, the positional deviations found in the method above is corrected prior to bonding.

The measurement of positional deviation can also be accomplished by imaging a bonded semiconductor device set in the bonding apparatus with a camera and displaying the image on a monitor.

Furthermore, as a result of the formation of the directional alignment marks 20 and 40 on the confirmation substrate part 10 and confirmation chip part 30, it can be checked to ascertain whether or not these two elements are properly aligned. If the directional alignment mark 40 of the confirmation chip part 30 is located within the directional alignment mark 20 of the confirmation substrate part 10 as shown in FIG. 1, then the directions of the confirmation substrate part 10 and confirmation chip part 30 are correctly aligned. However, if the orientation of the confirmation chip part 30 is incorrect, e. g., if the confirmation chip part 30 is in a state rotated 90 degrees to the left, then the directional alignment mark 40 appears at the lower left, and the directional alignment mark 40 does not coincide with the directional alignment mark 20; and necessary correction can be made base upon this alignment discrepancy.

In the above embodiment, the scale spacing of the X-axis measurement scale 41 and Y-axis measurement scale 42 is formed so that the scale spacing is smaller than the scale spacing of the X-axis measurement scale 21 and Y-axis measurement scale 22; however, it goes without saying that this scale spacing can also be formed so that it is larger than the scale spacing of the X-axis measurement scale 21 and Y-axis measurement scale 22.

Furthermore, the above description is made in regards to a flip-chip bonding confirmation part used in the bonding of a semiconductor device with a daisy-chain type pattern; however, the present invention can be applied to a general flip-chip bonding confirmation part which does not have a daisy-chain type pattern and to a flip-chip bonding part (which is an actual semiconductor device).

As seen from the above, in the present invention, both the substrate part and the chip part of a flip-chip bonding element used in bonding are made of transparent glass; accordingly, the bonding precision can be checked on the bonding apparatus, and both the bonding precision and electrical continuity can be also checked.

What is claimed is:

1. A flip-chip bonding part used in the bonding of a semiconductor device, wherein both a substrate part and a chip part that comprise said flip-chip bonding part are formed as transparent plate-form members.

2. A flip-chip bonding part according to claim 1, wherein measurement scales used for confirmation of bond alignment precision are respectively formed in corresponding positions of said substrate part and chip part.

3. A flip-chip bonding part according to claim 2, wherein said measurement scales used for bond alignment precision comprise two perpendicular axes consisting of an X-axis measurement scale and a Y-axis measurement scale.

4. A flip-chip bonding part according to claim 3, wherein a spacing of said X-axis measurement scale and Y-axis measurement scale of said chip part is set so as not to be equal to a spacing of said X-axis measurement scale and Y-axis measurement scale of said substrate part.

5. A flip-chip bonding part according to claim 3, wherein said X-axis measurement scale and Y-axis measurement scale of said chip part respectively include an X-axis scale reference line and Y-axis scale reference line, and said X-axis measurement scale and Y-axis measurement scale of said substrate part respectively include an X-axis scale reference line and Y-axis scale reference line, so that said X-axis scale reference line and Y-axis scale reference line of said chip part coincide with said X-axis scale reference line and Y-axis scale reference line of said substrate part.

6. A flip-chip bonding confirmation part according to claim 1, 2, 3, 4, or 5, wherein said flip-chip bonding part is a flip-chip bonding confirmation part which is used in the bonding of a semiconductor device provided with a daisy-chain type pattern thereon, and said substrate part and chip part are respectively a confirmation substrate part and confirmation chip part and are provided with daisy-chain type patterns thereon.

7. A flip-chip bonding method comprising the steps of: performing flip-chip bonding using said flip-chip bonding part according to claim 1, 2, 3, 4, or 5; and confirming a bonding precision and bonding conditions as well as an electrical continuity of bonded parts.

8. A flip-chip bonding method comprising the steps of: performing flip-chip bonding using said flip-chip bonding confirmation part according to claim 6; and confirming a bonding precision and bonding conditions as well as an electrical continuity of bonded parts.

* * * * *